US005631553A

United States Patent [19]
Bose et al.

[11] Patent Number: 5,631,553
[45] Date of Patent: May 20, 1997

[54] HIGH PRECISION RF VECTOR ANALYSIS SYSTEM BASED ON SYNCHRONOUS SAMPLING

[75] Inventors: Tapan K. Bose, Trois-Rivières; Raymond Courteau, Saint-Maurice, both of Canada

[73] Assignee: Université Du Québec À Trois-Rivières, Trois-Rivieres, Canada

[21] Appl. No.: 408,986

[22] Filed: Mar. 23, 1995

Related U.S. Application Data

[63] Continuation-in-part of Ser. No. 97,221, Jul. 27, 1993, abandoned.

[30] Foreign Application Priority Data

May 31, 1993 [CA] Canada ................... 2097397

[51] Int. Cl.⁶ .................................................. G11C 27/02
[52] U.S. Cl. .................... 324/76.24; 324/76.23; 324/76.42; 324/76.58; 327/92; 327/95; 327/96
[58] Field of Search .................. 324/76.42, 76.38, 324/76.24; 327/92, 93, 94, 95, 96

[56] References Cited

U.S. PATENT DOCUMENTS

| | | | |
|---|---|---|---|
| 4,263,521 | 4/1981 | Senger | 327/96 |
| 4,885,545 | 12/1989 | Sanielevici | 327/92 |
| 5,239,181 | 8/1993 | Sun | 327/92 |

OTHER PUBLICATIONS

"A High Precision RF Vector Analyzer Based on Synchronous Sampling" by Raymond Courteau, IEEE Transactions on Instrumentation and Measurement, vol. 43, No. 2, Apr. 1994, pp. 306–310.

*Primary Examiner*—Kenneth A. Wieder
*Assistant Examiner*—Jose M. Solis
*Attorney, Agent, or Firm*—Foley & Lardner

[57] ABSTRACT

The signals to be measured are transformed in the system to discrete time digital signals by synchronous sampling. These digital signals are then processed by a digital signal processor for vector detection and for computing digital feedback sent to the sampling gates. The analyzer has improved characteristics in the area of linearity, drift and test port signal injection because of its highly optimized architecture based on synchronous sampling with digital feedback. It possesses unique characteristics such as the ability to tune to a harmonic or a subharmonic of the excitation frequency and a good sensitivity in a high impedance environment.

13 Claims, 9 Drawing Sheets

HIGH PRECISION RF VECTOR ANALYSIS SYSTEM BASED ON SYNCHRONOUS SAMPLING

This application is a continuation-in-part application of U.S. patent application Ser. No. 097,221 filed Jul. 27, 1993 now abandoned.

BACKGROUND OF INVENTION

Field of the Invention

The invention relates to a system for accurately measuring the amplitude and relative phase of RF signals. More specifically, the invention relates to such a system which is based on synchronous sampling.

A) Operation of a conventional vector analyzer

Basically, a vector analyzer is a system which is used to measure the complex amplitude (i.e. the amplitude and relative phase) of one or more signals in the frequency domain. It is the basis for instruments such as vector network analyzers, vector voltmeters and modulation analyzers. Conventionally, a vector analyzer uses a heterodyne technique, R. A. Witte and J. W. Daniels, "An advanced 5 Hz to 200 MHz network analyzer", *Hewlett Packard Journal*, pp. 4–16, November 1984: the signals to be processed, whose frequency $f_{IN}$ may be any value inside the working range of the instrument, are first converted to a fixed intermediate frequency $f_{IF}$ by mixers. The mixers are non-linear devices with two input ports (IN, LO) and one output port (IF) configured in such a way as to produce an output signal at the frequency $f_{IF}$ through the relation $$f_{IF} = \pm(f_{IN} - m f_{LO}) \qquad (1)$$

where $f_{LO}$ is the frequency of the signal applied at the LO port. m is an integer equal to 1 for fundamental mixing and greater than 1 for "harmonic mixing". Using a bandpass filter at the IF port, the analyzer can be tuned to a frequency $f_{IN}$ by applying the appropriate LO frequency such that eq. (1) is satisfied.

The system is arranged to be linear with respect to the input IN, so that the amplitude and relative phase of the input signals are preserved by this mixing process. The resulting IF signals are filtered, amplified and generally frequency converted again, and finally go to a synchronous detector for quadrature and phase demodulation. Sweeping, i.e. tuning the analyzer at a frequency which changes over time, is accomplished by sweeping $f_{LO}$ in such a way that $f_{IF}$ is constant.

Some of the most important specifications for today's vector analyzers are its drift (or stability) and dynamic linearity. Other parameters which affect the accuracy of the instrument such as load match errors and frequency response errors are effectively cancelled out by normalization, calibration and vector correction techniques implemented in software. In practice the linearity is limited by the IF chain and the synchronous detector, and is generally about 0.02 dB for available commercial instruments. In the case of drift, it is mostly due to the variation in the transfer function of the mixer with temperature and aging, and typical values are 0.01 to 0.05 dB.

Our analyzer uses synchronous sampling rather than harmonic mixing to make the frequency conversion to a fixed IF frequency. Using this technique, we show that it is possible to improve the dynamic linearity and stability, at the expense of other factors which are not critical for many applications, such as measurement speed and spurious signal rejection.

B) Sampling techniques

Sampling systems were introduced for the observation of high speed repetitive signals, N. S. Nahman, "The Measurement of Baseband Pulse Rise Times of Less than $10^{-9}$ Second" Proceedings of the IEEE, Vol. 55, No. 6, June 1967, pp. 855–864. In these systems, a sampling gate, usually made of high speed Schottky diodes, is used to take a quasi-instantaneous snapshot of the input voltage at the time it receives a "sampling strobe". By taking a series of such samples over time it is possible to reconstruct the input waveform, provided it is repetitive and some known time relationship exists between the sampling strobe and the signal. The main interest of these techniques is that only the sampling gate determines the equivalent bandwidth of the system. The rest of the circuitry only has to process low frequency signals, contrary to a real time instrument. Some sampling systems now have over 30 GHz equivalent time bandwidth and around 1 psec time resolution.

Depending on the specific time relationship required by the instrument between the signal to acquire and the sampling strobe, we distinguish between three types of sampling techniques:

Sequential sampling: the signal to be measured goes to a trigger unit in addition to being applied to the sampling gate. When the system is ready to take a sample, it will wait until a trigger event occurs. The sampling strobe will be sent a given delay later by the sampling system; in order to get the complete waveform the delay is increased slightly for each sample. This technique is often used for TDR (Time Domain Reflectomerry) systems.

Random sampling: the sampling strobe is issued at a constant rate $f_S$ independent of the signal characteristics. When a trigger event occurs the time between it and the next sampling strobe is measured accurately and this value is used to compute the time index for preceding and succeeding samples. When a sufficiently high number of trigger events have occurred the time indexes will be nearly evenly distributed over the complete range from 0 to $1/f_S$, in which case the waveform can be displayed with sufficient resolution. Many modern digital oscilloscopes use random sampling to achieve a "repetitive bandwidth" greater than their real time sampling rate.

Synchronous sampling: is defined as a technique wherein the sampling strobe is applied at a constant $f_S$ and the input signal has a repetition frequency $f_{IN}$ which possess a known mathematical relationship with $f_S$. It is not necessary to be concerned about triggering, as a known synchronism exists between each sampling strobe and the input signal. Although not explicitly mentioned, it is used in special applications such as those found in N. D. Faulkner and E. V. Mestre, "Subharmonic sampling for the measurement of short-term stability of microwave oscillators", *IEEE Trans. Instr. Meas.*, Vol. IM-32, pp. 208–213, March 1983 and P. A. Weisskopf, "Subharmonic sampling of microwave signal processing requirements", *Microwave Journal*, pp. 239–247, May 1992.

Synchronous sampling has many resemblances to harmonic mixing: even the circuits of a harmonic mixer and a sampling gate may share some common points. The differences that exist are: 1) the excitation of a sampling gate is generally at a much lower frequency than that of a harmonic mixer ($f_S < f_{LO}$) and, more important 2) the output signal of a harmonic mixer is a continuous time signal whereas the output of a sampling gate is a sequence of samples.

Although B. Gestblom, "The sampling oscilloscope in dielectric frequency domain spectroscopy", *J. Phys. E: Sci. Instrum.*, Col. 15, pp. 87–90, 1982 and R. H. Cole, "Bridge sampling methods for admittance measurements from 500 KHz to 5 GHz", *IEEE Trans. Instr. Meas.*, Vol IM-32, pp. 42–47, March 1983, have discussed the use of sequential sampling oscilloscopes for complex amplitude measurement in the frequency domain for simple systems, the present invention provides much more functionality in terms of automation, accuracy and effectiveness.

SUMMARY OF INVENTION

In the present invention, the signals to be measured, whose frequencies are $f_{IN}$, are brought to sampling gates which receive a sampling command at a frequency $f_S$. This sampling frequency $f_S$ is generated by a sampling strobe synthesizer (SSS) using frequency synthesis techniques applied to a master reference clock. The same reference frequency will be used by the external. signal source which provides an excitation to the measured system. This is to ensure that the input signals to be measured have a frequency $f_{IN}$ which is linked to $f_S$ by an exact relationship as is required for synchronous sampling, as discussed above.

The main object of the invention is to create an RF vector analyzer of high stability and linearity, to be used as the basis for a high precision wide band network analyzer or other kind of RF electrical parameter measurement.

Another object of the invention is the creation of an RF vector analyzer which requires a minimum of critical RF components to define its performance.

Another object of the invention is the creation of an RF vector analyzer which minimally loads the signals to measure so that buffers, which inevitably introduce drift and non-linearities, are not needed for measurements in a high impedance environment.

Another object of the invention is the creation of an RF vector analyzer which can be tuned at harmonics or sub-harmonics of the main frequency of the input signals, so that complete characterization of nonlinear devices such as large signal amplifiers can be made.

The operating principles put in use in our invention are particularly effective for instruments whose frequency range is situated between 100 KHz and 10 GHz or more. Aspects of the present invention are set out in Applicant's article entitled "A High-precision RF Vector Analyser Based on Synchronous Sampling", IEEE Transactions on Instrumentation and Measurement, Vo. 43, No. 2, April 1994.

In accordance with a particular embodiment of the invention there is provided an RF/microwave amplitude and phase measurement system comprising:

a sampling system comprising a plurality of sampling gates, each sampling gate having an input terminal, an output terminal and a control terminal;

a sampling strobe synthesizer having an output terminal connected to the control terminals of said sampling gates;

a discrete time signal processor (DTSP) having a plurality of input terminals, respective ones of the output terminals of said sampling gates being connected to respective ones of the input terminals of said DTSP, said DTSP also including a like plurality of channels, each channel being associated with a respective input terminal of said DTSP, and a plurality of output terminals;

a reference clock;

wherein:

signals to be measured are connected to a respective one of said input terminals of said sampling gates;

the sampling gates and the sampling strobe synthesizer being used in a synchronous sampling mode for frequency conversion and domain conversion;

the outputs of the sampling system comprise sequences of samples or discrete time signals where each sample represents the value of the input voltage at the sampling instant, the discrete time signal having a number of samples per cycle T (i.e. a period) equal an inverse of to a function of the fractional part of the input frequency divided by the sampling frequency, the function being given by the following equation:

$$\frac{1}{T} = frac\left(\frac{f_{IN}}{f_S}\right) \text{ for all } frac\left(\frac{f_{IN}}{f_S}\right) \leq 0.5; \text{ otherwise}$$

$$\frac{1}{T} = 1 - frac\left(\frac{f_{IN}}{f_S}\right)$$

where T is equal to the period of the discrete time signals;

$f_{IN}$ is equal to the frequency of the input signals;

$f_S$ is equal to the sampling frequency;

the "frac" operator means the fractional part of its argument;

the sampling frequency being obtained by frequency synthesis techniques applied by the sampling strobe synthesizer to the output of the reference clock;

the outputs of the DTSP comprising, for each channel, the real and imaginary part of the signal input on that channel.

BRIEF DESCRIPTION OF DRAWINGS

The invention will be better understood by an examination of the following description, together with the accompanying drawings, in which.

DESCRIPTION OF PREFERRED EMBODIMENTS

Figure 1:
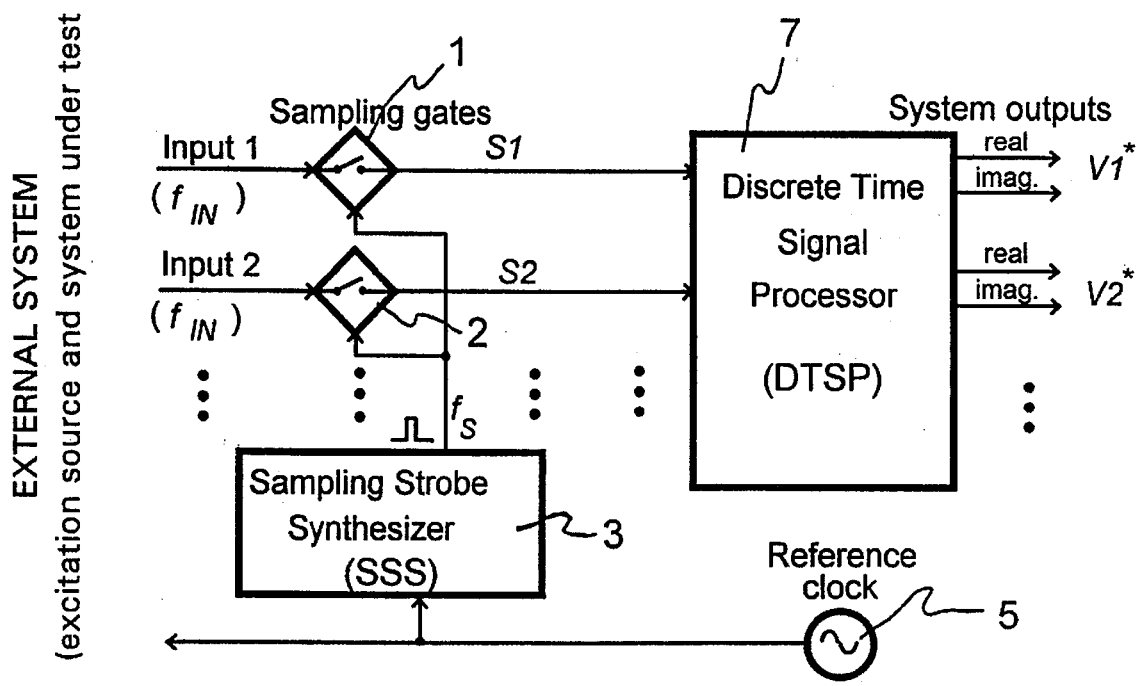
FIG. 1 is a block diagram of a vector analyzer which uses synchronous sampling for frequency conversion and domain (continuous time to discrete time) conversion.

Referring to FIG. 1, it can be seen that input signals 1, 2, ... are applied to sampling gates 1, 2, ... The opening and closing of the gates are controlled at a sampling frequency $f_S$, and the sampling frequency $f_S$ is generated by a sampling strobe synthesizer (SSS) 3 using frequency synthesis techniques on the output of master reference clock 5. The outputs of the SSS are applied to the control terminals of the sampling, gates 1, 2, . . .

The outputs S1, S2, . . . of the sampling gates are applied to inputs of discrete time signal processor (DTSP) 7.

The output signals of the sampling gates, consisting of sequences of samples, are considered as discrete time signals and it can be shown that these sequences are periodical with a period (i.e. a unitless period being the number of samples per cycle) T given by the following equation:

$$\frac{1}{T} = frac\left(\frac{f_{IN}}{f_S}\right) \quad (2)$$

where the "frac" operator stands for the fractional part of its argument. Discrete time filtering and phase sensitive detection can then be done by a discrete time signal processor (DTSP) 7 which will deliver two outputs per channel representing the complex amplitude of the input RF voltages V*, for example the real part and imaginary part as shown in FIG. 1. Thus the synchronous sampling process can be viewed as a frequency conversion ($f_{IN}$ to 1/T) and domain conversion process (continuous time to discrete time). In our system it plays a role similar to that of the harmonic mixing process of the conventional analyzer. Also, the DTSP processor plays the role of the IF chain and phase sensitive detector, while the sampling strobe synthesizer is equivalent to the local oscillator.

Figure 5:
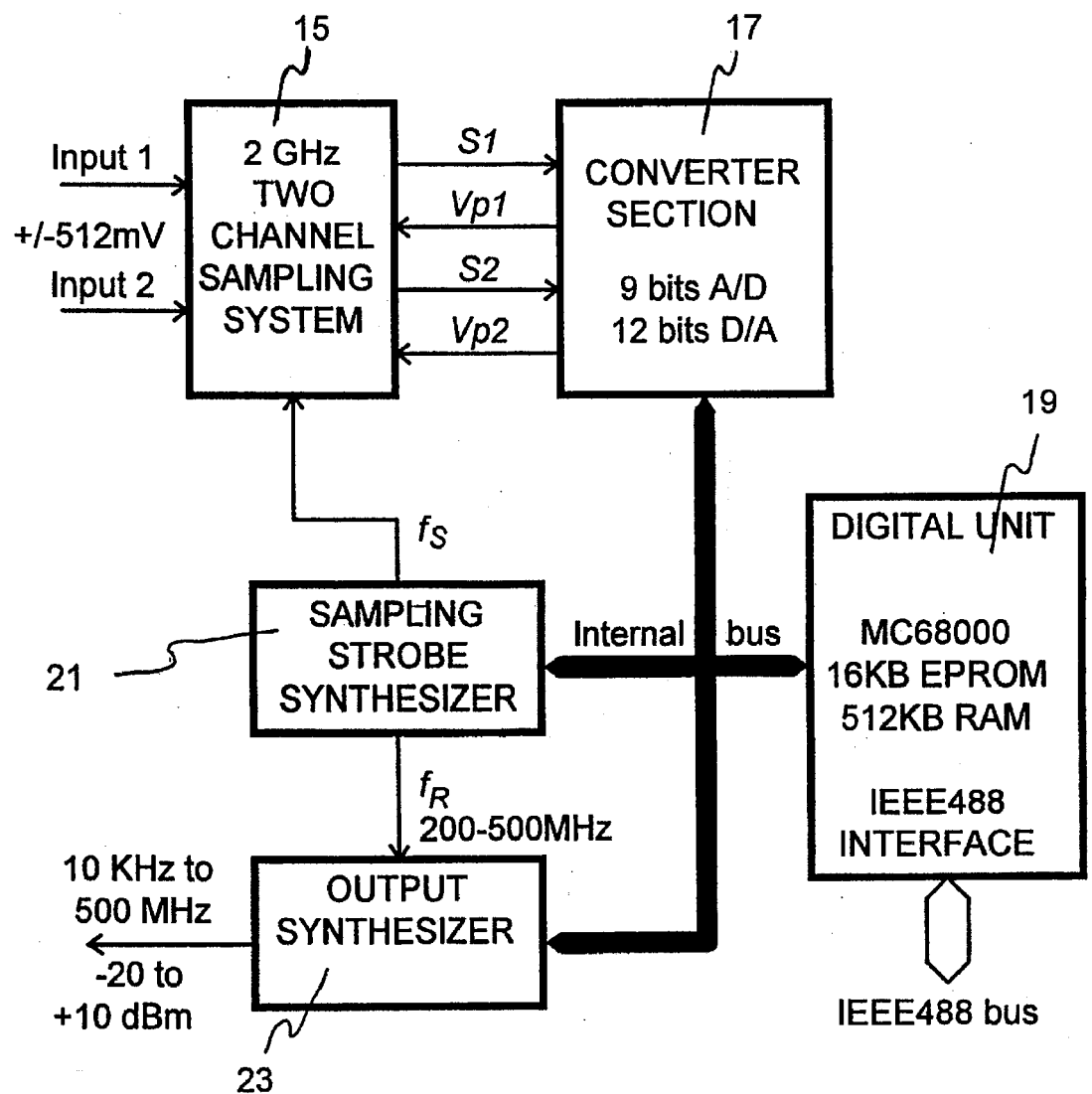
FIG. 5 is the complete block diagram of the preferred embodiment of the invention.

As was the case with the heterodyne analyzer, it is better from a practical point of view if the signal processor operates on fixed frequency signals. Furthermore, it is desirable that the period T of the series is an integer, as it does simplify considerably the design of the DTSP. As a result, tuning of the analyzer is preferably done by adjusting $f_S$ in such a way that eq. (2) is satisfied. For this purpose, the SSS is controlled by a digital control unit 19 as shown in FIG. 5. It can be shown that the required value for $f_S$ given the desired period T is $$f_S = \frac{F_{IN}}{X \pm 1/T} \quad (3)$$

where X is a positive integer whose value is chosen according to the following equation:

$$X = \text{int}\left(\frac{f_{IN} - f_{S\,max}/T}{f_{S\,max}}\right) + 1 \quad (4)$$

The "int" operator means truncation of its argument to an integer, and $f_{Smax}$ is the maximum sampling frequency permitted by the DTSP. As a typical example, with $f_{Smax}$=50 KHz and T=256, for an input frequency of 100 MHz an adequate value of X is 2000 and the required sampling frequency $f_S$ is 50 KHz minus 0.097656 Hz. To cover an input frequency range of 100 KHz to 2 GHz, X will take the values ranging from 2 to 4000 and $f_S$ will span from 33.355 to 50 KHz.

It is noted that the output signal of the sampling gates has a real time frequency of $f_S/T$ which changes for different input frequencies; only the frequency of the discrete time signal is constant for different input frequencies. The choice of an appropriate period T for the discrete time signal is a compromise between the performance in regard to harmonic rejection, the measurement speed and the complexity of the DTSP. Powers of two between 16 and 4096 are probably the most useful values in every situation.

Figure 2:
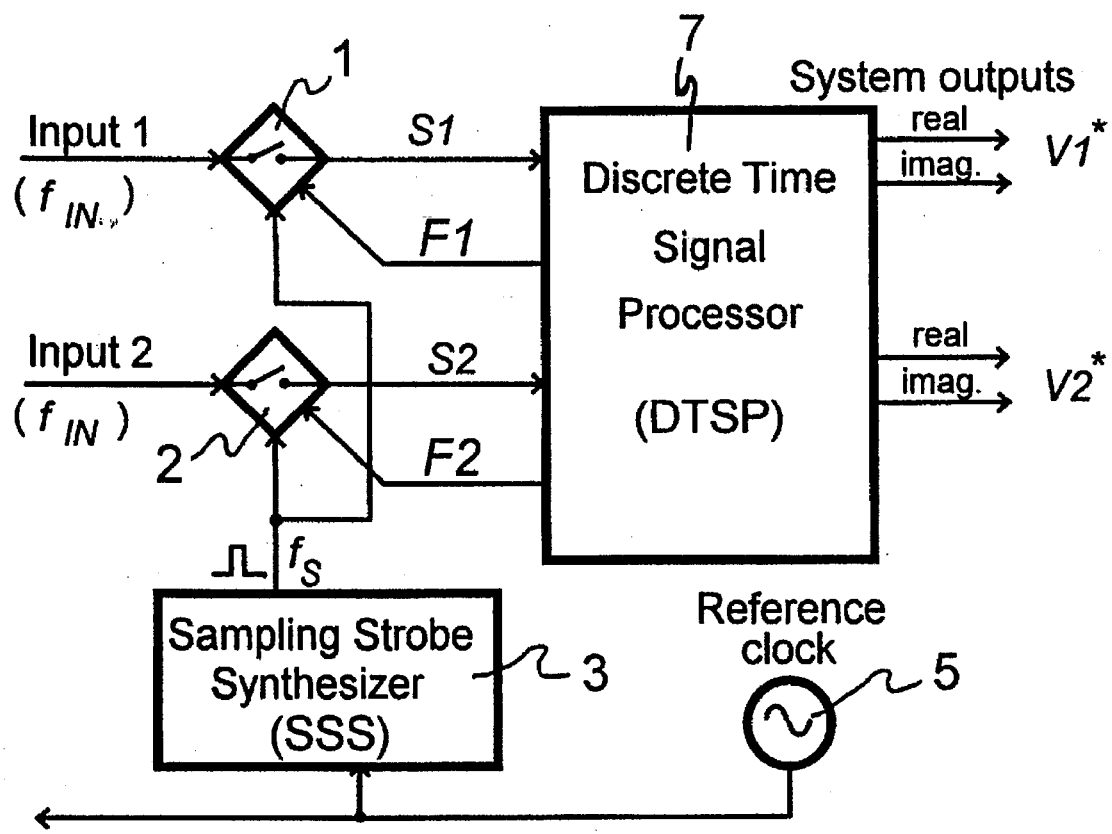
FIG. 2 is a block diagram of a vector analyzer similar to that of FIG. 1 but where feedback is used to the sampling gates.
Figure 3:
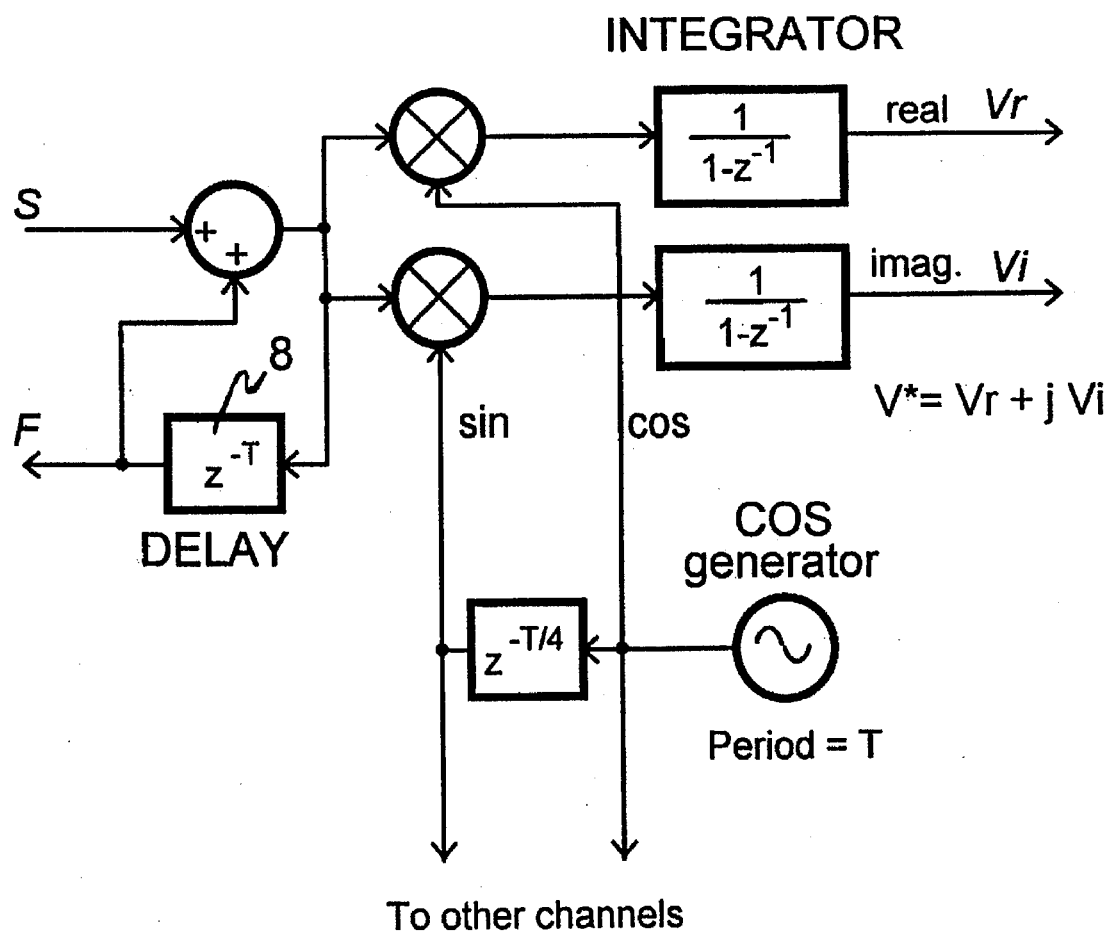
FIG. 3 is a flowgraph showing the signal processing done by the discrete time signal processor.

It is also contemplated, in accordance with the invention, to use feedback at the sampling gates in such a way that the output signals are the result of the comparison between the feedback voltage F1, F2, . . . and the instantaneous RF voltage S1, S2, . . . as shown in FIG. 2. Most sampling gate topologies have a polarization or feedback input and the circuitry associated with the sampling gate actually delivers a signal which is proportional to the difference between the sampled RF voltage and the voltage applied at the feedback input. Since in the present case is known to produce periodic series, it is possible to predict sample values for the next period of the discrete time signal and to apply corresponding voltages at the feedback inputs. The objective is to reach a steady state after the first few cycles of the process so that the output signals of the sampling section are zero, except for some possible noise. After a few cycles the feedback signals F1, F2, . . . will converge to an exact representation of the input waveforms. The output signals S1, S2, . . . from the sampling gates are now considered to be error signals. FIG. 3 represents a simple flowgraph to be implemented by the DTSP to generate the required F1, F2, . . . signals and to measure the complex amplitudes. If no feedback is used, then the delay element 8 may be removed.

The benefit of this technique is that the variation in the transfer function of every component in the chain from the RF inputs to the feedback signals F1, F2, . . . will not affect the results, in the same way that a properly designed feedback control system will be insensitive to perturbations and variations in the direct chain. Particularly important, the gain of the sampling gate is one parameter whose variations will not affect the system. This implies higher compression levels or greater dynamic range, and better drift characteristics. Another way to look at this technique is to consider that for each sample, the system compares the value of the estimation and the actual sample value. On subsequent cycles it will adjust this estimation so as to minimize the error signal.

Another benefit of synchronous sampling with feedback is that when a steady state is reached, no energy is needed from the measured signal. This translates to a higher effective input impedance for the analyzer which can be put to good use for special applications.

Figure 4:
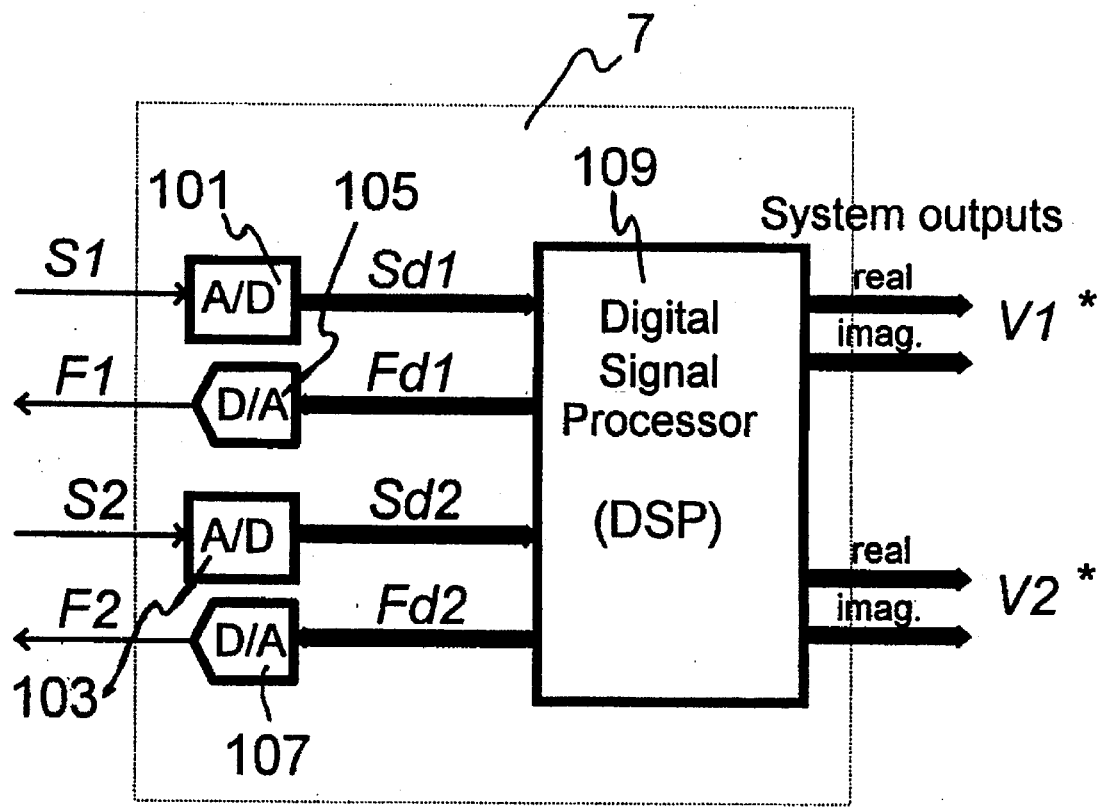
FIG. 4 is a block diagram showing our implementation of the discrete time signal processor.

As shown in FIG. 4, one implementation of the DTSP 7 consists of using analog to digital converters (A/D) 101, 103, digital to analog converters 105, 107 (D/A), and a digital signal processor (DSP) 109. Each sample of the signals S1, S2, . . . is digitized and the resulting sequences of numbers represent the digital signals Sd1, Sd2, . . . These digital signals have the same properties as the discrete time signals S1, S2, . . . except for the presence of quantization noise which can be made negligibly small if enough bits are used to represent them. They are processed by the DSP according to the same flowgraph of FIG. 3, in digital form. The DSP generates the digital signals Fd1, Fd2, . . . which are converted to discrete time signals F1, F2, . . . by D/A converters for feedback purposes. The measurement results V1*, V2*, . . . are in digital form. The main advantages of working with digital signals is elimination of drift, added flexibility, and, when properly implemented, negligible systematic errors. In particular detector circularity errors, which are phase dependent amplitude errors, can be made insignificant.

A complete block diagram of the system based on the principles described above is shown in FIG. 5. It includes: a two channel sampling system 15 having a 3 dB bandwidth of 2 GHz; a converter section 17 comprising one 12 bits D/A converter with a full scale range of ±512 mV and one 9 bits A/D converter for each channel; a digital unit 19 which fulfills the role of main controller, digital signal processor and IEEE488 bus interface; a sampling strobe synthesizer 21 which can tUNe the system at every frequency produced by the accompanying output synthesizer; and an output synthesized signal source 23 covering the frequency range from 10 KHz to 500 MHz with four digits of resolution at any frequency and with programmable output power from −20 to +10 dBm. Sweeping is done by sequentially stepping through a user selected number of output frequencies.

The digital unit is based on a MC68000 microprocessor operating at 8 MHz, along with 16 KB of EPROM and 512 KB of RAM. It handles all the chores of system control, DSP algorithms and IEEE488 communications. Every subsystem is linked to the digital unit through an internal bus comprising 16 data lines, 14 control lines and 5 power lines. DSP algorithms are implemented by highly optimized routines with a loop time of 40 μsec, resulting in a maximum permitted sampling rate $f_{Smax}$ equal to 25 KHz. Actually, the algorithms are somewhat more elaborate than what is shown in FIG. 3, as it includes non-linear adaptive filtering to speed up the convergence process and sophisticated initialization procedures that help reduce the sweep time for successive sweeps. Higher values of $f_{Smax}$ are desirable to get shorter measurement time for a given signal to noise ratio. Several possibilities exist to attain that objective; the most simple one would be to upgrade the design of the digital unit to work at a higher clock speed, such as 16 MHz, in which case $f_{Smax}$ becomes equal to 50 KHz. A more aggressive way would be to use a dedicated DSP chip such as a member of the Motorola DSP56000 family, in which case $f_{Smax}$ could be well over 200 KHz.

No user interface has been provided; our analyzer is intended to be part of a larger system comprising a computer which implements the required functionality of a measurement system with its user interface. This computer interacts with the analyzer through the IEEE488 bus by using a communication protocol consisting of a command set and defined output formats. The only direct control the user has on the analyzer is setting the IEEE488 bus address through DIP switches and a reset button.

Figure 6:
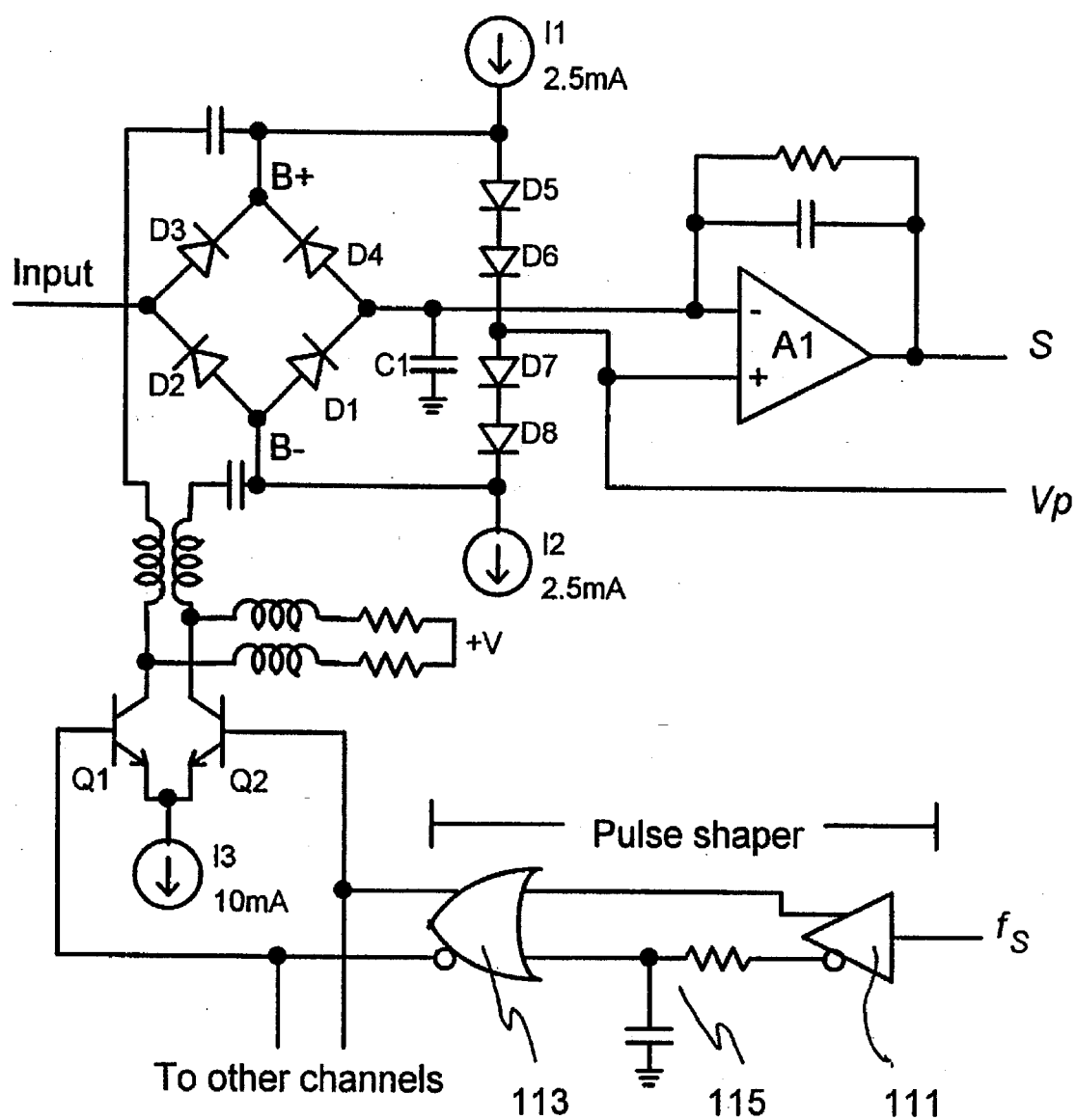
FIG. 6 is the circuit diagram of the sampling section showing the sampling gate and associated circuitry.

At the heart of the analyzer is the sampling system 15 as it contains the sampling gates which defines the most important performance parameters of the analyzer. FIG. 6 shows the schematic diagram for one channel.

The sampling gate is made of Schottky diodes D1, D2, D3 and D4 in surface mount packages. A four diodes bridge topology is used because of its better isolation compared to a two diodes gate. The bridge is normally reverse biased at approximately 2.2 V by the action of current sources I1, I2, and a string of four Schottky diodes D5, D6, D7 and D8. The polarization voltage $V_p$ is applied at the mid point of the diode string and the effect of operational amplifier A1 is to keep the output side of the bridge at that same potential. At the sampling instant the bridge is briefly turned on by the current injected at nodes B+ and B− from the differential pair of transistors Q1 and Q2. If there is a voltage difference between the input and output of the bridge, a current will flow in the holding capacitor C1. The total charge gained or lost in C1 after completion of sampling is approximately 0.02 pC per mV of voltage difference. This charge is converted to a voltage by A1 and then amplified.

Figure 9:
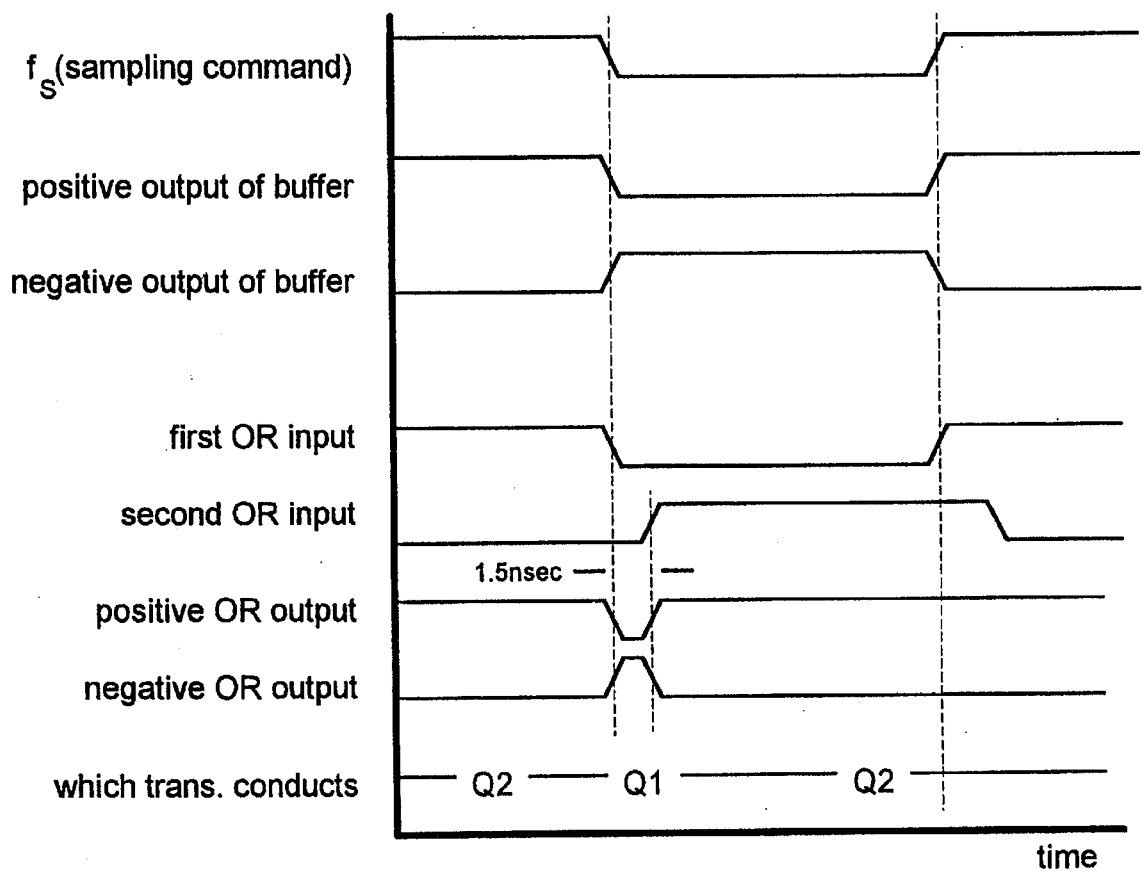
FIG. 9 is a timing diagram useful in understanding the operation of the circuit illustrated in FIG. 6.

Sampling occurs when the sampling system receives a sampling command. The sampling command is applied to a circuit identified as "Pulse Shaper" in FIG. 6. Every signal involved in the pulse shaper are digital ECL level signals, so a logical 0 is represented by a voltage of approximately −1.7 V and a logical 1 by −0.8 V. The pulse shaper comprises a buffer 111 having complimentary outputs. One output of the buffer 111 is applied directly to one input of an OR gate 113 with complementary output, and the other output goes to an RC 115 network and then to a second input of the same OR gate 113. The function of the RC network is to introduce a small delay (about 1.5 nsec) from the negative output of the buffer to the second input of the OR gate. When the signal $f_S$ (sampling command) is low or high, the output of the OR gate is high because at least one of its input is high (logical 1). But when $f_S$ switches from high to low, both inputs of the OR will be low for a brief moment because of the delay introduced by the RC network, at which time the output of the OR gate will be low before returning high when this delay is elapsed. The operation may be best understood with the help of the timing diagram given in FIG. 9. Thus the output of the OR gate is a pulse approximately 1.5 nsec wide. This pulse drives the microwave transistor pair Q1–Q2, resulting in temporary forward biasing of the bridge by 7.5 mA.

Through careful construction we were able to get 2 GHz bandwidth, 2 mVrms equivalent input noise and less than 15 mV kickout at input. These figures do not represent state of the art; 10 GHz bandwidth can easily be attained using hybrid technology, and over 30 GHz with GaAs monolithic circuits. It is sufficient however to obtain interesting characteristics for our analyzer over the 10 KHz to 500 MHz frequency range.

Not shown in FIG. 6 is the fact that the current sources can be trimmed, as is the offset voltage of A1. They are adjusted to as to compensate for the bridge imperfect balance, in order to minimize charge injection at the RF input and the peak amplitude of the coupled sampling pulse. Also, damping resistors are included at various places in the circuit to minimize ringing due to parasitic impedances. The number of channels can be increased simply by duplicating the circuits of FIG. 6, except for the pulse shaper.

An efficient way we found to obtain the required relationship between $f_S$ and $f_{IN}$ (eq. (3)) consists of deriving both of them from a 200–500 MHz synthesized signal that we call $f_R$ and restrict the input frequency to values that can be expressed by $$f_{In} = f_{R/D} \qquad (5)$$

where D is a positive integer. Eq. (3) then becomes $$f_S = \frac{f_R}{DX \pm D/T} \qquad (6)$$

When D/T is an integer, $f_S$ can be obtained by simple digital frequency division of $f_R$ using programmable counters. When it is not, as is most often the case, fractional division must be done. To do this, a M/M+1 type counter is used along with a digitally controlled analog time interpolator. The counter is set to count by a number M which is $$M = DX + \text{int}\left(\frac{D}{T}\right) \qquad (7)$$

and the digital unit maintains an accumulator A which is incremented by the quantity (D modulo T) at every sample. When the accumulator reaches a value greater than T, the M+1 input of the counter is activated and T is subtracted from the accumulator. In this way, the total number of additional cycles of $f_R$ to produce T samples is (D modulo T), which is exactly what is required to satisfy eq. (6) when averaged over T samples.

Should the sampling strobe be taken directly from the counter, $f_S$ would have instantaneous frequency fluctuations which would show up as sampling phase errors that are specially harmful for small values of D. Rather, the counter drives a time interpolator that inserts a delay ranging from 0 to 5 nsec before producing the sampling strobe. At every sample the delay is set to a value proportional to the value contained in accumulator A times $f_R$ by the digital unit. This results in elimination of sampling phase errors.

This technique of fractional frequency division is similar to the technique of fractional-N frequency synthesis. The difference is that we use time interpolation rather than phase interpolation.

Figure 7:
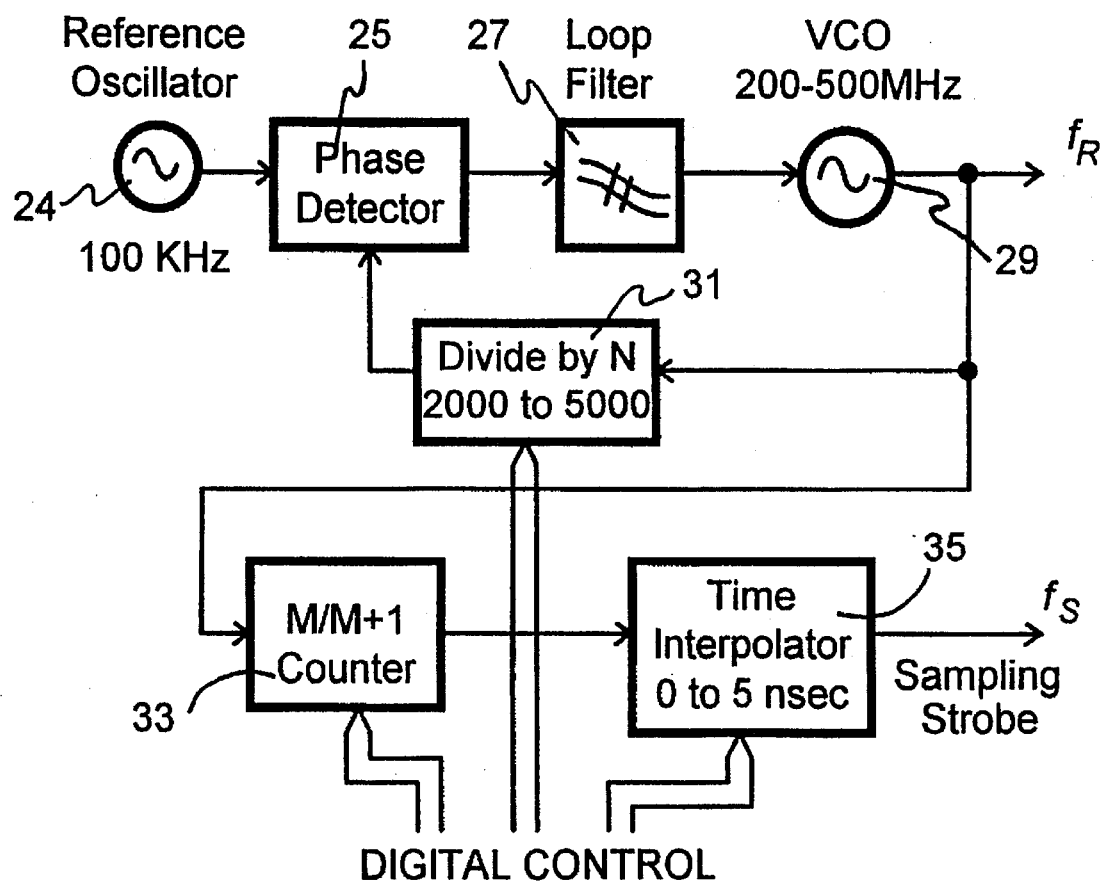
FIG. 7 is the block diagram of the preferred embodiment for the sampling strobe synthesizer.

FIG. 7 shows the block diagram of the sampling strobe synthesizer. The signal $f_R$ is generated by a phase locked loop (PLL) consisting of oscillator 24, phase detector 25, loop filter 27, VCO 29 and divider 31, and spans the range 200–500 MHz with a resolution of 100 KHz. This defines the relative frequency resolution of the instrument to nearly four digits because of eq. (5). This also dictates a frequency settling time constant of 100 µsec, since the bandwidth of a PLL cannot be more than a few percent of the reference frequency. Higher resolution could be attained by using a multiloop approach or fractional-N synthesis.

The signal $f_R$ goes to the M/M+1 counter 33. The value M can be programmed within the range 512 to 65535. This counter is designed using a combination of ECL and HCMOS circuits. The time interpolator 35 comprises a current switch made of high speed bipolar transistors, a timing ramp defined by a current source and a capacitor, a comparator and a 10 bits digital to analog converter. The delay may be programmed with a resolution of 5 psec and is linear to better than 50 psec. The total time jitter of the system is about 30 psec rms.

Figure 8:
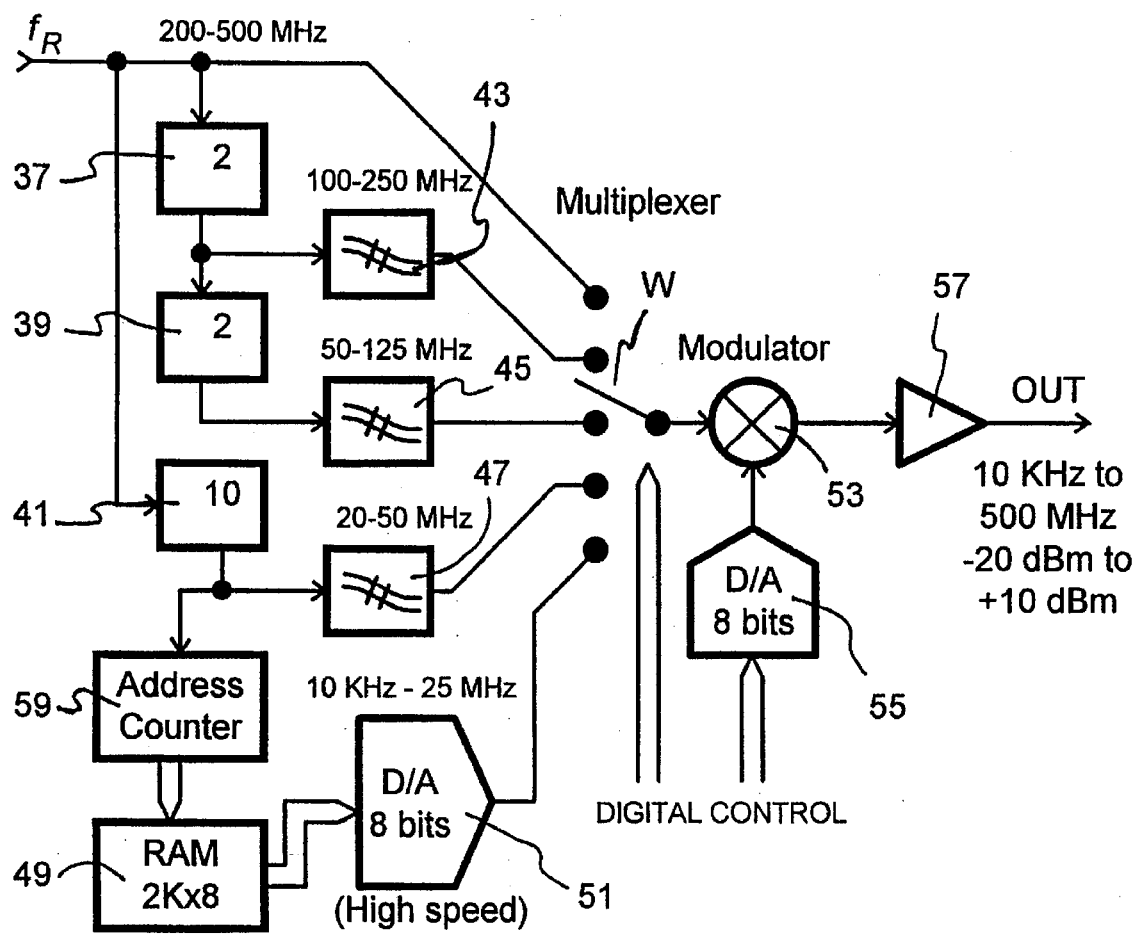
FIG. 8 shows one embodiment of an output synthesizer for providing an excitation signal to the system under test and specially adapted to work with the preferred embodiment of the invention.

Although not necessarily part of the vector analyzer, our system includes an output synthesizer to generate an excitation signal to the external system under test which illustrates how to attain the condition of eq. (5). FIG. 8 shows the block diagram of the 10 KHz to 500 MHz output synthesizer. The total frequency range is divided into five bands; the four highest bands are obtained through frequency division by 1, 2, 4 or 10 of $f_R$ using prescalers 37, 39 and 41 followed by low pass filters 43, 45 and 47 to remove harmonics. The lowest band, which covers 10 KHz to 25 MHz, uses an arbitrary waveform generator architecture where an 8 bits D/A is fed by data from a RAM 49 containing a sine approximation. Address for the RAM 49 is provided by a counter 51 clocked at $f_R/10$. One output cycle is composed of n points, where n can take the values 2, 4, 10, 20 and so on. Table I shows the characteristics for each band.

The output of RAM 49 is connected to a terminal of multi-position switch SW1. The outputs of filters 43, 45 and 47 are fed to different positions of the same switch. The frequency $f_R$ is also fed to a different position of switch SW1.

Wiper W of SW1 is then connected to one input of modulator 53. The other input of the modulator 53 is fed, through D/A converter 55 from the digital control. The output of the modulator is fed to amplifier 57 to the output of the system.

This architecture may appear complicated compared to using a heterodyne band for the low frequencies as do most wideband synthesizers. Remember, however, that eq. (5) must be satisfied for our system. Also this architecture has the advantage of a constant relative frequency resolution over the complete frequency range, compared to a constant absolute resolution for a heterodyne type synthesizer. Another advantage is that there is virtually no non-harmonic spurious signal generation. Finally, with present state of the art technology, arbitrary waveform generation could be done to 500 MHz, and with dedicated integrated circuits this would result in a very small number of components. This would also make it possible to test components with complex waveforms so as to simulate real life operation.

The main characteristics of the output synthesizer are:

harmonics: −40 dBc up to 6 MHz, −25 dBc up to 500 MHz;

amplitude: −20 to +10 dBm, ±2 dB accuracy;

frequency switching speed: frequency settles exponentially with a 100 µsec time constant (determined by the reference synthesizer); initial frequency error is at most 2.5 times the final frequency.

TABLE I

CHARACTERISTICS OF EACH BAND OF THE OUTPUT SYNTHESIZER

| Band number (sub band) | Output freq. range (MHz) | Resolution (KHz) | Number of data points (n) | Value of D (Eq. (5)) |
|---|---|---|---|---|
| 1 | 200–500 | 100 | — | 1 |
| 2 | 100–250 | 50 | — | 2 |
| 3 | 50–125 | 25 | — | 4 |
| 4 | 20–50 | 10 | — | 10 |
| 5 (1) | 10–25 | 5 | 2 | 20 |
| 5 (2) | 5–12.5 | 2.5 | 4 | 40 |
| 5 (3) | 2–5 | 1 | 10 | 100 |
| 5 (4) | 1–2.5 | 0.5 | 20 | 200 |
| 5 (5) | 0.5–1.25 | 0.25 | 40 | 400 |
| 5 (6) | 0.2–0.5 | 0.1 | 100 | 1000 |
| 5 (7) | 0.1–0.25 | 0.05 | 200 | 2000 |
| 5 (8) | 0.05–0.125 | 0.025 | 400 | 4000 |
| 5 (9) | 0.02–0.05 | 0.01 | 1000 | 10000 |
| 5 (10) | 0.01–0.025 | 0.005 | 2000 | 20000 |

Frequency range extension to 1 or 2 GHz could be accomplished by using frequency doublers and increasing the number of inputs for the multiplexer of FIG. 7.

A summary of the main characteristics which have been measured for the analyzer are:

Dynamic range: ±512 mV, +4.2 dBm into 50 ohm.

Measurement time: 20 msec per frequency to 1 min.

Noise floor: decreases as the square root of the measurement time from 60 µVrms(−71 dBm into 50 ohm) for 20 msec to 2 µVrms (−101 dBm into 50 ohm) for 20 sec. measurement. Noise free dynamic range is 82 dB for 0.1 sec. measurement.

Dynamic accuracy: better than 0.01 dB for smaller than 150 mVrms input (−3.5 dBm).

Drift:
  0.0001 dB 10 KHz to 5 MHz.
  0.002 dB at 100 MHz
  0.004 dB at 200 MHz
  0.01 dB at 500 MHz
  from ambient temp. constant to ±2 C.

Although particular embodiments have been described, this was for the purpose of illustrating, but not limiting, the invention. Various modifications, which will come readily to the mind of one skilled in the art, are within the scope of the invention as defined in the appended claims.

We claim:

1. An RF/microwave amplitude and phase measurement system comprising:

a sampling system comprising a plurality of sampling gates, each sampling gate having an RF input terminal, an output terminal and a control terminal;

a sampling strobe synthesizer operating at a $f_S$ having an output terminal connected to the control terminals of said sampling gates;

a discrete time signal processor (DTSP) having a processing signal having a predetermined number of samples per cycle, a plurality of input terminals, respective ones of the output terminals of said sampling gates being connected to respective ones of the input terminals of said DTSP, said DTSP also including a like plurality of channels, each channel being associated with a respective input terminal of said DTSP, and a plurality of output terminals;

a reference clock;

wherein:

signals to be measured are connected to a respective one of said input terminals of said sampling gates;

the sampling gates and the sampling strobe synthesizer being used in a synchronous sampling mode for frequency conversion and domain conversion;

the outputs of the sampling system comprise sequences of discrete time signal signal samples where each sample represents the value of the input voltage at the sampling instant, said discrete time signal having a number of samples per cycle T equal to an inverse of a function of the fractional part of the input frequency $f_{IN}$ of the input signals divided by the sample frequency $f_s$; said function being given by:

$$frac\left(\frac{f_{IN}}{f_s}\right), \text{ for all } \left(\frac{f_{IN}}{f_s}\right) \leq 0.5,$$

and otherwise being given by 1-frac $$\left(\frac{f_{IN}}{f_s}\right);$$

the "frac" operator defining the fractional part of its argument;

the sampling strobe syntheiszer comprising frequency synthesis means connected to the output of the reference clock;

said number of samples per cycle in said signals processed by said DTSP being equal to T; and the outputs of the DTSP comprising, for each channel, the real and imaginary part of the signal input on that channel.

2. An RF/microwave vector analyzer in accordance with claim 1 further comprising a digital control unit, comprising said reference clock, and where the DTSP operates on discrete time signals having a suitable number of samples per cycle T which is constant for every possible input frequency $f_{IN}$, tuning of the analyzer being done by the digital control unit controlling the sampling strobe synthesizer so as to deliver a sampling frequency $f_S$ given by $$f_S = \frac{f_{IN}}{X \pm 1/T}$$

where

X is a positive integer computed from the following equation:

$$X = int\left(\frac{f_{IN} - f_{Smax}/T}{f_{Smax}}\right) + 1$$

$f_{Smax}$ being the maximum sampling frequency permitted by the discrete time processor;

the "int" operator means the integer part of its argument.

3. An RF/microwave vector analyzer in accordance with claim 2 wherein each gate of said plurality of sampling gates includes an additional feedback input terminal, said sampling gates delivering at their outputs sequences of samples where each sample value is proportional to the voltage difference between the RF input and the feedback input at the sampling instant, and where the DTSP further comprises one more output for each channel which are connected to said feedback inputs of said sampling gates, the DTSP driving said feedback inputs in a manner that this feedback is, for every sample acquired by the sampling gates, and estimation of the sampled RF voltage so that the outputs of the sampling gates are error signals which are used to reestimate the feedback voltages for successive cycles of the discrete time signals.

4. An RF/microwave vector analyzer in accordance with claim 1 wherein the DTSP consists of one analog to digital converter for each sampling channel and a digital signal processor (DSP) having a plurality of inputs and plurality of outputs, the outputs of said sampling gates being connected to the inputs of said analog to digital converters, the outputs of said analog to digital converters being sequences of numbers or digital signals that are applied to the inputs of said DSP, the outputs of said DSP comprising, in digital form and for each channel, the real and imaginary part of the signal input on that channel.

5. An RF/microwave vector analyzer in accordance with claim 2 wherein the DTSP consists of one analog to digital converter for each sampling channel and a digital signal processor (DSP) having a plurality of inputs and plurality of outputs, the outputs of said sampling gates being connected to the inputs of said analog digital converters, the outputs of said analog to digital converters being digital signals that are applied to the inputs of said DSP, the outputs of said DSP comprising, in digital form and for each channel, the real and imaginary part of the signal input on that channel.

6. An RF/microwave vector analyzer in accordance with claim 3 wherein the DTSP consists of one analog to digital converter and one digital to analog converter for each sampling channel, and a digital signal processor (DSP) having a plurality of inputs and plurality of outputs, where the outputs of the sampling gates are connected to the inputs of the analog to digital converters;

the outputs of the analog to digital converters consist of digital signals that are applied to the inputs of the DSP;

the outputs of the digital to analog converters are connected to the feedback inputs of the sampling gates;

the inputs of the digital to analog converters are driven by the DSP with a digital signal which represents the feedback voltages in digital form.

7. An RF/microwave vector analyzer in accordance with claim 2 wherein the frequency of the input signals is restricted to be an integer multiple or sub-multiple of a reference frequency $f_R$ generated by the sampling strobe synthesizer and where said sampling strobe synthesizer derives the sampling frequency $f_S$ from said frequency $f_R$ by fractional division with digitally controlled analog time interpolation.

8. An RF/microwave vector analyzer in accordance with claim 3 wherein the frequency of the input signals is restricted to be an integer multiple or sub-multiple of a reference frequency $f_R$ generated by the sampling strobe synthesizer and where said sampling strobe synthesizer derives the sampling frequency $f_S$ from said frequency $f_R$ by fractional division with digitally controlled analog time interpolation.

9. An RF/microwave vector analyzer in accordance with claim 4 wherein the frequency of the input signals is restricted to be an integer multiple or sub-multiple of a reference frequency $f_R$ generated by the sampling strobe synthesizer and where said sampling strobe synthesizer derives the sampling frequency $f_S$ from said frequency $f_R$ by fractional division with digitally controlled analog time interpolation.

10. An RF/microwave vector analyzer in accordance with claim 5 wherein the frequency of the input signals is restricted to be an integer multiple or sub-multiple of a reference frequency $f_R$ generated by the sampling strobe synthesizer and where said sampling strobe synthesizer derives the sampling frequency $f_S$ from said frequency $f_R$ by fractional division with digitally controlled analog time interpolation.

11. An RF/microwave vector analyzer in accordance with claim 6 wherein the frequency of the input signals is restricted to be an integer multiple or sub-multiple of a reference frequency $f_R$ generated by the sampling strobe synthesizer and where said sampling strobe synthesizer derives the sampling frequency $f_S$ from said frequency $f_R$ by fractional division with digitally controlled analog time interpolation.

12. A sampling gate circuit comprising an RF input, a polarization feedback input, a gate output, a four-diodes sampling bridge gate means whose input side is connected to said RF input, operational amplifier to maintain said output side at the same potential as a voltage applied at the feedback input, a positive input of said amplifier being connected to the polarization feedback input, a negative input of said amplifier being connected to said gate output by a feedback network comprising a capacitor in parallel with a resistor, with the output of said operational amplifier being connected to said gate output and producing a voltage pulse for every sample whose magnitude is proportional to the difference between the sampled RF input and the voltage present at the polarization feedback input.

13. An RF/microwave vector analyzer in accordance with claim 8 wherein the sampling system comprises, for each channel, a four diodes bridge sampling gate whose output side is maintained at the same potential as the estimated RF sampled voltage by using an operational amplifier having its positive input connected to the feedback voltage, its negative output connected to the output of the sampling gate, and further having a feedback network consisting of a resistor and a capacitor between the operational amplifier's output and negative input, with the output of said operational amplifier being the output of the sampling section and producing a pulse for every sample whose magnitude is proportional to the difference between the sampled RF input and the feedback voltage.

* * * * *